(12) United States Patent
Washiya et al.

(10) Patent No.: US 8,192,637 B2
(45) Date of Patent: Jun. 5, 2012

(54) METHOD AND APPARATUS FOR IMPRINTING MICROSTRUCTURE AND STAMPER THEREFOR

(75) Inventors: Ryuta Washiya, Hitachi (JP); Takashi Ando, Hitachi (JP); Masahiko Ogino, Hitachi (JP); Akihiro Miyauchi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 398 days.

(21) Appl. No.: 12/388,573

(22) Filed: Feb. 19, 2009

(65) Prior Publication Data

US 2009/0243126 A1 Oct. 1, 2009

(30) Foreign Application Priority Data

Mar. 31, 2008 (JP) .................. 2008-089186

(51) Int. Cl.
*B44C 1/22* (2006.01)
(52) U.S. Cl. ........... 216/22; 425/385; 264/319; 264/292
(58) Field of Classification Search .................. 977/877
See application file for complete search history.

(56) References Cited

U.S. PATENT DOCUMENTS

| 2004/0200368 | A1 | 10/2004 | Ogino et al. | |
| 2005/0191419 | A1* | 9/2005 | Helt ............................. | 427/256 |
| 2006/0258163 | A1* | 11/2006 | Ohashi et al. ................. | 438/735 |
| 2006/0279025 | A1 | 12/2006 | Heidari et al. | |
| 2007/0132152 | A1* | 6/2007 | Choi et al. .................... | 264/401 |
| 2008/0042319 | A1* | 2/2008 | Ando et al. .................... | 264/293 |
| 2008/0217822 | A1* | 9/2008 | Chou et al. .................... | 264/496 |

FOREIGN PATENT DOCUMENTS

| JP | 2004-288845 | 10/2004 |
| JP | 2007-055235 | 3/2007 |
| JP | 2007-281072 | 10/2007 |
| JP | 2007-320071 | 12/2007 |

OTHER PUBLICATIONS

Schuster et al, mr-NIL 6000 New epoxy-based curing resist for efficient processing in combined thermal and UV nanoimprint lithography, 2007, SPIE, Emerging Lithographic Technologies XI.*
Nielsen et al, Flexible stamp for nanoimprint lithography, 2005, IEEE, p. 508-5111.*
Kehagias, Stamp replication for thermal and UV nanoimprint lithography using a UV-sensitive silsesquioxane resist, 2009, Microelectronic Engineering, 86, p. 776-778.*
Office Action of JP App. No. 2008-89186 dated Jun. 22, 2010 with partial translation.

* cited by examiner

*Primary Examiner* — Binh X Tran
*Assistant Examiner* — David Cathey, Jr.
(74) *Attorney, Agent, or Firm* — Antonelli, Terry, Stout & Kraus, LLP.

(57) ABSTRACT

A method of imprinting a microstructure comprising: contacting a stamper comprising a pattern layer with the microstructure of the order of from micrometers to nanometers in one face of the pattern layer and a substrate supporting the pattern layer with an imprinting member having a deformable layer to which the microstructure is imprinted, wherein the pattern layer is supported on a round surface having a prescribed radius of curvature of the substrate, the center of the round surface protruding towards the rear face of the pattern layer; causing the deformable layer on the imprinting member; and separating the stamper from the cured deformable layer.

8 Claims, 15 Drawing Sheets

METHOD AND APPARATUS FOR IMPRINTING MICROSTRUCTURE AND STAMPER THEREFOR

CLAIM OF PRIORITY

The present application claims priority from Japanese patent application serial No. 2008-89186, filed on Mar. 31, 2008, the content of which is hereby incorporated by reference into this application.

FIELD OF THE INVENTION

The present invention relates to a method of imprinting a microstructure of an order of micrometers to nanometers on an article, an apparatus for imprinting the microstructure and a stamper having the microstructure in a face thereof for imprinting the microstructure on the article. The microstructures may be classified into micrometer order structures and nanometer order structures.

Recent years, microstructurization or shrinking of semiconductor integrated circuits are being in progress more and more. In order to realize micro-fine machining for the microstructurization, a high precision machining of pattern forming of the semiconductor integrated circuits has been conducted by using a photolithographic device. However, there may be a limit for shrinking the micromachining because the order of the micro-machining has come to close to the wavelength of the exposure light. In order to further aim at microstructurization, an electron beam drawing device, which is a kind of charged particle ray apparatus has been used in place of photolithography apparatus.

However, the larger the number of patterns, the longer an exposure time (drawing time) for forming patterns to be drown by the electron beam drawing device becomes, unlike one shot exposure using i-ray, excimer laser, etc. As a result, the time for forming patters becomes longer thereby to drastically lower throughput as the density of integration of the semiconductor integrated circuits increases.

In order to speed up the pattern formation by the electron beam drawing device one-shot exposure methods where various shapes of masks are combined through which the electron beam is irradiated have been developed. However, The electron beam drawing devices employing the one shot exposure methods should become large in size and the devices need mechanisms to control positions of masks precisely, which increases the price of the devices.

On the other hand, there are known imprint technologies to form patterns wherein patterns formed in the face of a stamper are pressed onto an article to print the patterns. The imprint technology uses the stamper having protrusions corresponding to patterns that is pressed onto an article to be imprinted, the article having a resin layer on a substrate. By this method it is possible to form patterns with a size of 25 nm or less on the resin layer. The pattern formed resin layer (pattern forming layer) consists of a thin film layer formed on the substrate and pattern layer having protrusions formed on the thin film.

There may be a case where there are projected portions in the surface of the surface to be imprinted that are larger than the size of the protrusions. In imprinting on the surface having such the projected portions the patterns of the stamper do not sufficiently reach the resin layer so that the patterns in the vicinity of the projected portions are not formed or the stamper may be damaged. In order to avoid the above problem stampers of flexible polymer films have been proposed by Japanese patent laid open print 2007-55235.

SUMMARY OF THE INVENTION

The imprint technology has been studied for applications to pattern forming of recording pits of large scaled recording media, and pattern forming of semiconductor integrated circuit substrates. For example, the large scaled recording media and semiconductor integrated circuit substrates are manufactured by etching. Machining precision of etching of the substrate depends on distribution of thickness in a plane direction of the thin film layers. For example, if a member to be imprinted having a difference of 50 nm in a thickness distribution between the maximum thickness and the minimum thickness in a plane direction of the thin film layer is etched out, there may remain portions where they are not etched out. Since the thicker the thin films, the larger the deformation of the projected portions after the thin films are removed becomes. At the same time, the etching precision of the substrate tends to be lower. Accordingly, in order to maintain the predetermined etching precision it is necessary to make thin and homogeneous the thickness of the thin film formed on the substrate. In the specification, the substrate is a resin coat carrying substrate, which is hereinafter referred to as an imprinting member, wherever appropriate.

In methods of imprinting microstructures the member carrying a deformable layer to be imprinted and a pattern layer of the stamper are contacted and pressed to each other throughout the whole surfaces thereof. As a area of the imprinting expands, there may be a local imbalance of a force applied to the pattern layer and the deformable layer, which leads to hindrance of resin flow or inclusion of bubbles. As a result, an homogeneous resin layer may be formed. Thus, it is difficult to make thin the resin film, while the homogeneous and minimum resin thickness is desirable for maintaining the etching precision.

In forming micro-patterns on a semiconductor integrated circuit substrate or large scaled recording medium substrates a relative position between the stamper and the member to be imprinted must be aligned with high precision, prior to pressing the stamper towards the deformable layer of the member.

A stamper made of flexible polymerizable film (resin stamper) disclosed in Japanese patent laid-open 2007-55235 is possible to be imprinted even if the member carrying the deformable layer has projections. This film is useful for increasing precision of imprinting. However, since the entire face of the resin stamper makes a contact with the entire face of the deformable layer from the beginning time of pressing, the insufficient resin flow of the deformable layer and inclusion of bubbles are caused to dispersion of thickness of the resulting printed pattern. The resin stamper made of the flexible resin material deforms by stress at the time of handling thereof. Therefore, it is possible to precisely align the relative position between the stamper and the deformable member to be imprinted.

As having discussed, in the conventional imprinting technologies it was difficult to precisely align the stamper and deformable member and to produce an imprinted pattern member, which has a constant height of the microstructure.

The present invention aims at providing a method of imprinting a microstructure and an apparatus for imprinting the microstructure that are capable of forming the imprinting member having the constant height, further a stamper and a deformable member to be imprinted are positioned precisely for imprinting. The present invention also aims at providing a stamper suitable for the method and the apparatus.

In the specification, an imprinting member is used to mean a member carrying a deformable layer to which the microstructure is imprinted by the stamper.

In the specification "the imprinted member having a constant height" is used to mean that the matrix film from which the microstructure or minute protrusions extends have a constant thickness, and is substantially homogeneous throughout the matrix film.

The imprinted member according to the present invention comprises the microstructure of the order of micrometers to nanometers and a matrix film integrated with the microstructure and supporting it.

The present invention provides:

1. A method of imprinting a microstructure comprising:

contacting a stamper comprising a pattern layer with the microstructure of the order of from micrometers to nanometers in one face of the pattern layer and a substrate supporting the pattern layer with an imprinting member having a deformable layer to which the microstructure is transferred, wherein the pattern layer is supported on a round surface having a prescribed radius of curvature of the substrate, the center of the round surface protruding towards the rear face of the pattern layer;

causing the deformable layer on the imprinting member to be cured; and separating the stamper from the cured deformable layer.

2. The method of imprinting microstructure in the above method, wherein the curing of the deformable layer that contains photo-curable component is conducted under irradiation of light for curing the deformable layer through the substrate and the pattern layer.

3. The method of imprinting the microstructure in any of the above method, wherein the deformable member is a thermoplastic resin sheet or film.

4. The method of imprinting microstructures in the above method, wherein the substrate of the stamper has a Young's modulus higher than that of the pattern layer.

5. The method of imprinting the microstructure in any of the above method, wherein the substrate and the pattern layer have transparency to light for curing the deformable layer.

6. The method of imprinting the microstructure in any of the above method, wherein the substrate and the imprinting member have alignment marks for aligning the pattern layer and the deformable member.

7. The method of imprinting the microstructure in any of the above method, wherein the pattern layer is fitted with a frame formed between the substrate and the periphery of the substrate.

8. The method of imprinting the microstructure in any of the above method, wherein the round face has different curvatures.

9. An imprinting apparatus comprising:

a stamper comprising a pattern layer having a microstructure and a substrate supporting the pattern layer with a round face having a prescribed radius of curvature, the round face protruding towards the rear face of the pattern layer, the substrate having a mark for aligning it with a deformable layer on an imprinting member;

a first mechanism for aligning the substrate and the deformable layer on the imprinting member; and a second mechanism for applying a force to the stamper and/or the member carrying the deformable layer and separating the stamper from the member.

10. The imprinting apparatus in the above apparatus, which further comprising an irradiation means for irradiating light to cure the deformable layer.

11. The imprinting apparatus in any of the above apparatus, which further comprising a stage for moving the imprinting member in relation to the pattern layer, the stage is driven by a second mechanism.

12. The imprinting apparatus in any of the above apparatus, wherein the substrate and the pattern layer have transparency to the light for curing the deformable layer.

13. A stamper for imprinting a microstructure comprising a pattern layer having microstructures and a substrate supporting the pattern layer with a round face having a prescribed radius of curvature, wherein the round face protrudes towards the rear face of the pattern layer. The round face may include one that is smooth and one that has one or more cavities.

14. The stamper for imprinting a microstructure in the above stamper, wherein the round face has different curvatures.

15. The stamper for imprinting the microstructure in any of the above stamper, wherein a Young's modulus of the substrate is larger than that of the pattern layer.

16. The stamper for imprinting the microstructure in any of the above stamper, wherein the pattern layer is fitted with a frame in a groove formed between a periphery of the pattern layer and the substrate.

17. The stamper for imprinting the microstructure in any of the above stamper, wherein the transparency of the substrate is higher than that of the pattern layer.

18. The stamper for imprinting the microstructure in any of the above stamper, wherein one face of the substrate to be opposed to a deformable layer to be imprinted has a mark for aligning the stamper and the deformable layer.

19. A method of manufacturing a recording medium disc comprising:

preparing an imprinted member by pressing the stamper defined above against a deformable member supported on a substrate to imprint the microstructure on the deformable member, separating the stamper from the imprinted member after the deformable member is cured;

placing the imprinted member on a medium disc substrate as a dry etching mask in such a manner that the rear face (having no microstructure) of the imprinted member is contacted with the surface of the disc;

subjecting the surface of the medium disc to dry etching through the etching mask to form a pattern according to the imprinted microstructure; and forming a recording film on the imprinted pattern on the substrate after the mask is removed.

According to the present invention, an imprinted member comprising a resin matrix having a constant thickness and a microstructure is produced with high precision. The resin matrix of the imprinted member is substantially homogeneous because the deformable member to which a stamper is pressed is pressed at a substantially constant pressure throughout the entire face of the deformable member. Therefore, the present invention provides useful imprinted products for various fields such as recording media, biotechnology, optical devices, etc.

DETAILED DESCRIPTION OF THE PREFERRED EMBODIMENTS

Figure 1A:
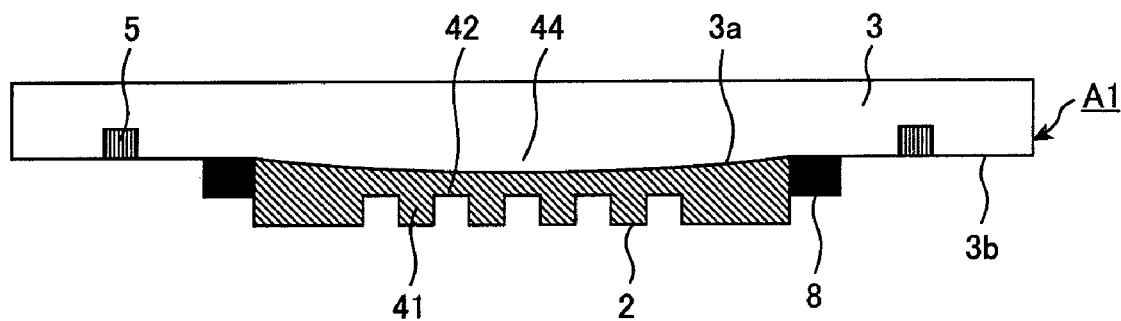
FIG. 1A and FIG. 1B show diagrammatic sectional views of stampers according to embodiments of the present invention.

The preferred embodiments of the present invention will be explained in detail by reference to drawings. In accompanied FIG. 1A a stamper A1 comprises a substrate 3 made of glass, for example, and a microstructure layer 2 made of resin, for example. The microstructure layer has protrusions 41 of the order of micrometers to nanometers. The pattern layer 2 is fitted to the substrate 3 by means of a frame 8 made of glass, which is bonded to the substrate by an adhesive. The rear face of the pattern layer 2 has a curved face 3a.

The substrate 3 has a round portion the center part of which protrudes towards the rear face of the pattern layer 2. The pattern layer 2 is supported on the round portion 44. The round portion 44 has a prescribed radius of curvature. The round portion may have one or more curvatures. The height of the pattern layer is substantially constant as shown in the figure. The pattern layer 2 comprises a resin matrix 42 from which the protrusions 41 extend.

Figure 1B:
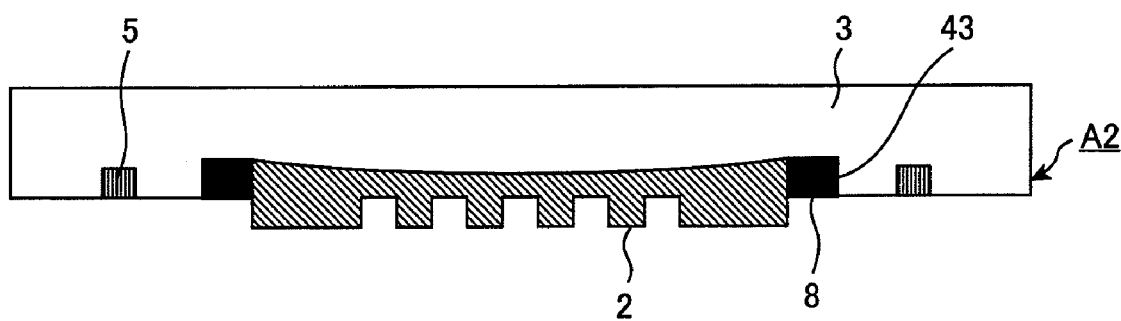

In FIG. 1B the structure of the stamper A2 is the same as in FIG. 1A, except that the frame 8 is buried in a groove 43 formed around the pattern layer 2 to fit it to the substrate 3.

The substrate 3 and the pattern layer 2 have preferably transparency to light ray, which is used to irradiate an uncured resin layer to photo-polymerize it to cure. The substrate has a curved face 3a and flat face 3b. There is an alignment mark 5 for aligning the stamper and a deformable member to be imprinted.

Since the substrate 3 has a round portion with a curved face 3a, there are the following technical advantages.

(1) In preparing the pattern layer 2 of the stamper wherein an original pattern is pressed to the uncured photo-curable resin layer to be the pattern layer 2 and the pressed resin layer is cured by irradiation with ultraviolet ray. In this process the pressure is substantially uniform over the entire faces of the resin layer and the original pattern. In other words a pressure is such that the central portion of the resin layer is larger than other portion. A pressure distribution from the central portion to the peripheral portion changes with time. That is, the central portion of the resin layer deforms largest, and the deformation becomes smaller as it comes to the periphery thereof. As a result, it is presumed that contour lines of pressure on the resin layer 2 are formed.

(2) When the pattern layer resulted in the preparation of the resin pattern 2 of the stamper contacts under pressure with a deformable resin layer to be imprinted, the same phenomenon as in (1) takes place. Therefore, a pattern layer with high precision is obtained. That is, the pattern layer has a constant height that follows the contour of the pattern layer of the stamper. There is no hindrance of resin flow and imprint default due to undulation or projections on the surface of the substrate. This is because a thickness of the deformable layer to be imprinted can be made minimum by the formation of the round portion of the substrate.

The stamper shown in FIG. 1B differs from that of FIG. 1A in that the frame is buried in a groove formed in the substrate. In this example, a groove is formed on the surface of the substrate 3, and a curved face is formed in the bottom of a concave. The stamper is held in the curved face of the concave. FIG. 1B differs from FIG. 1A in that the pattern layer 2 is disposed in the concave of the substrate. By arranging the pattern layer 2 in the concave of the substrate 3, it is possible to keep a small distance between the pattern face of the pattern layer 2 and the face where the alignment mark 5 is formed. As a result, it is possible to make positioning of the stamper and the imprinting member with high precision.

In the following there is described a method of preparing a stamper, which is mentioned in (1) above.

An original mold plate 12 was prepared as in FIG. 2(a). The mold plate comprises a mold pattern 12 and a first frame 13 surrounding the mold pattern 12, and a second frame 8 made of glass on the first frame 13. A liquid photo-curable resin 4a is filled in the cavity formed in the frames 13, 8.

A substrate having a round portion 44 and a groove 43 is pressed towards the photo-curable resin 4a to the mold pattern 12 to imprint the liquid resin 4a, as shown in FIG. 2(b).

Then, ultra violet ray 51 from a light source 46 is irradiated to the photo-curable resin 4a through the substrate 3 to cure the resin 4a as shown in (c). Thereafter, the stamper having the pattern layer 2 and a frame 8 surrounding the pattern layer is separated from the original mold pattern as shown in FIG. 2(d).

Figure 3A:
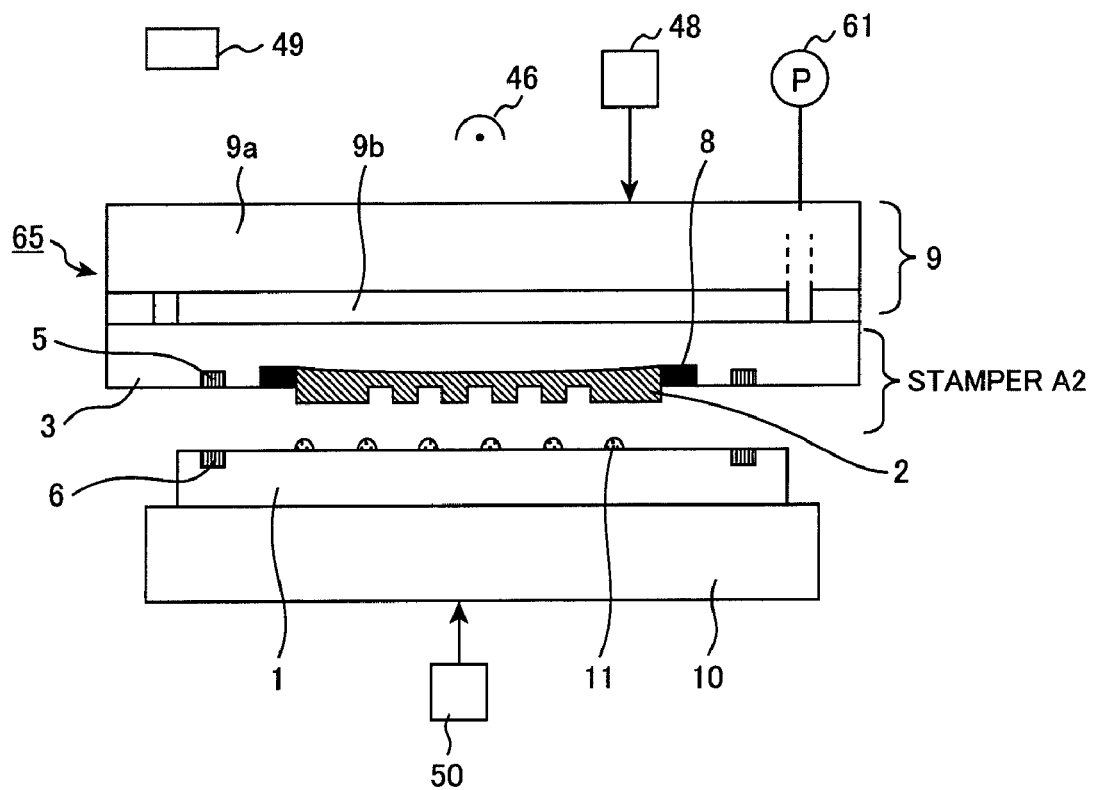
FIG. 3A is a cross sectional diagrammatic view of an imprinting apparatus of an embodiment of the present invention.

In the following a imprinting apparatus that uses the stamper A2 will be explained by reference to FIGS. 3A, 3B and 3C.

The substrate 3 is fixed to a plate 9 by vacuum suction through a vacuum suction port 7a. The plate 9 consists of two transparent plates 9a, 9b. The plate 9a has the vacuum suction port 7a for vacuum suction of the substrate and the plate 9b has a vacuum suction port 7b for vacuum suction of the pattern layer 2. The suction ports 7a, 7b are connected to a vacuum pump 61.

A imprinting member 1 for a deformable layer 65 is mounted on a stage 10. The stage 10 is equipped with control means 64 for moving the stage 10 in X,Y,Z directions in cooperation with a pressing means 62 disposed to the plate 9 of the stamper. The control means 64 controls parallelism between the stamper and the imprinting member 1 carrying the deformable layer 65.

The flat face 3b of the substrate 3 has a positioning mark 5 and the opposite face of the imprinting member 1 has another positioning mark 6 so that the stamper and the deformable layer are aligned precisely.

The marks 5, 6 of ring shape are formed by dry etching on the substrate 3 and imprinting member 1. Alignment of the substrate and imprinting member is conducted by detecting reflection light from the marks 5, 6 with a photo-sensor 66.

The detected signal is sent to the control means 64 to feed-back control the stage 10, etc.

Next, a method of imprinting the microstructure will be explained by reference to FIGS. 3A to 3C and 4. The imprinting member 1 having a coat of photo-curable resin 11 is set on the stage 10. The pattern layer 2 of the stamper 65 is opposed to the resin coat 11 and aligned by moving the stage 10 in horizontal direction by means of the marks 5, 6 as shown in FIG. 3A. In FIG. 3A components for the imprinting apparatus, in addition to the stamper and the stage, are a photo-detector 49 for detecting marks 5, 6, a light source 46 for UV light, an alignment device 48, a vacuum pump 61 and a control device 50.

The stage 10 is lifted towards the pattern 2 to contact the coating 11 (deformable layer) thereby to spread the deformable layer by the pattern 2 of the stamper. Thus, the microstructure is imprinted in the resin coating as shown in FIG. 4(b). Ultra violet ray is irradiated through the transparent substrate 9 and the pattern 2 to cure the resin coating 2 as shown in FIG. 4(c). After the resin coating is cured, the stage 10 is moved downward to separate the stamper from the imprinted layer on the imprinting member as shown in FIG. 4(d). As a result, an imprinted microstructure formed on the imprinting member was obtained.

Figure 3B:
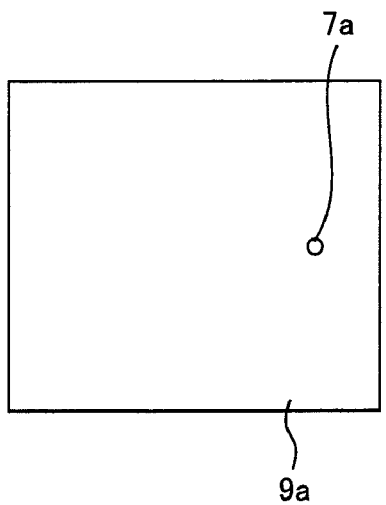
FIGS. 3B and 3C show plan views of plates for supporting the stamper.
Figure 3C:
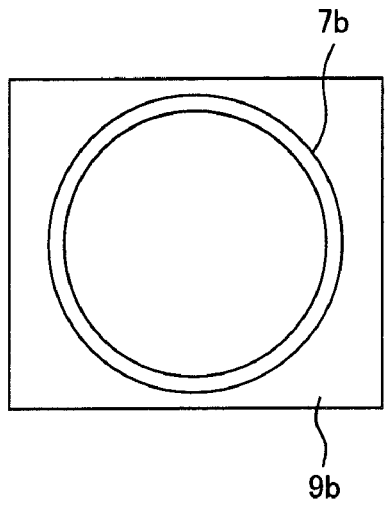

FIG. 3B shows a plan view of the plate 9a having a suction port 7a and FIG. 3C shows a plan view of a plate 9b having a circular vacuum suction port 7b.

According to the method of imprinting the microstructure of the present invention, the deformable resin layer coated on the imprinting member can follow the microstructure of the stamper very well, unlike the method disclosed in Japanese patent laid-opens 2005-38596 and 2007-55235. Since the insufficient resin flow, which may be caused by local stress concentration, is prevented, a constant height of the imprinted pattern layer is obtained. The stamper and the deformable layer are precisely aligned by means of the positioning marks.

The method of imprinting of the present invention is not limited to the above one; various modifications or changes can be made within the spirit of the present invention.

In the above example the pattern layer was formed on one face of the imprinting member; it may be possible to form the pattern layers on both faces of the imprinting member, wherein the resin coatings are formed on both faces of the imprinting member.

The pattern layer 2 was bonded to the substrate 3 with an adhesive such as thermosetting resin or photo-curable resin, but the pattern layer 2 can be fixed by vacuum suction by means of the suction ports 7a, 7b or by an electrostatic chuck or mechanical fixing means.

As a material for the deformable layer, there are phenol formaldehyde resin, urea formaldehyde resin, melamine formaldehyde resin, unsaturated polyester resin, vinylester resin, epoxy resin, polyimide resin, polyamide resin, ABS resin, methyl metacrylate resin, polystyrene copolymer resin, AAS resin, polyarilate resin, cellulose acetate resin, polypropylene, polyethylene terephthalate, polybutylene terephthalate, polyphenylene sulfide, polyphenylene oxide, polystyrene, polycarbonate, etc. The pattern layer may be formed by different resin materials in multiple layers.

Prior to contacting the deformable layer 11 with the pattern layer 2, the deformable layer and the pattern layer may be exposed to reduced pressure or a inert gas atmosphere so as to accelerate the curing reaction of the deformable layer.

As materials for the deformable layer 11 to form the imprinted pattern layer, various known photo-curable resins such as cyclo-olefin polymer, polymethyl methacrylate, polystyrene polycarbonate, polyethylene terephthalete (PET), polylactate, polypropylene, polyethylene, polyvinylalcohol, etc are exemplified.

A method of coating the deformable layer on the imprinting member 1 includes dispense method, spin coat method, etc. In the dispense method one or more droplets of the photo-curable resin are dropped on the imprinting member 1. The droplets on the imprinting member 1 are spread over the surface when the stamper is contacted with the droplets. If the deformable layer is the droplets, a distance between the droplets should preferably be larger than the diameter of the droplets. Further, positions at which the droplets of the polymerizable resin are dropped are predetermined based on evaluation of the polymerizable resin on the imprinting member 1 in advance. An amount of the polymerizable resin is equal to that required for forming the pattern layer or larger than that required for the pattern layer.

As the imprinting members, there are resin coated substrates, resins including resin sheets, etc. If thermoplastic materials are used, the imprinting member is kept at a temperature higher than a glass transition temperature of the resin materials, before the pattern layer 2 and the deformable layer 11 are contacted and pressed. After they are contacted and pressed, they are cooled. If thermosetting resin materials are used as the imprinting member 1, the imprinting member 1 and the pattern layer 2 are kept at a temperature for curing the thermosetting resin materials. After the thermosetting resins are cured, the stamper and the imprinting member 1 carrying the imprinted layer of the deformable layer are separated.

As the materials for the imprinting member of the imprinting member 1, there are silicon single crystal, glass, aluminum alloys, resins, etc. The surface of the imprinting member 1 may be coated or covered with metal film, resin film, oxide film, etc.

An outer contour of the imprinting member 1 may be chosen in accordance with usage, such as circular, oval, polygonal form, etc. A center hole may be formed in the imprinting member 1, if necessary.

A positioning mark may be formed in the surface of the stage. The positioning marks 5, 6 are in ring form, but the shape thereof may be chosen freely. For example, there are straight line, circle, polygon, cross, etc.

The positioning marks 5, 6 are formed in the above embodiment, but they may be metal film, dielectric film, etc, as long as transmittance of them are detected with a photo-sensor.

The original mold plate 12 has a microstructure with protrusions of the order of micrometers to nanometers to be imprinted to the deformable layer 2. The pattern of the original plate was formed by an ion beam drawing method. Other methods for forming the pattern includes photo-lithography method, focused ion beam lithography method, electroplating method, etc. The methods are appropriately selected in accordance with required precision of patterns to be formed.

The stampers A1, A2 are formed by irradiation of the photo-curable resin 11 with electro-magnetic ray such as ultra violet ray through the substrate 3. The substrate 3 must be transparent to the electromagnetic ray. However, the pattern layer 2 should also preferably be transparent because the pattern layer 2 should transmit the electromagnetic ray in imprinting.

The outer shape of the substrate 3 may be circular, oval, polygonal, etc. The substrate may have a center hole. The frame 8 may have different shapes.

The surface of the pattern layer 2 may be coated with a separator such as fluorine containing polymers, silicone polymers, etc to assist separation of the deformable layer 11 from the pattern layer 2. Further, a metallic compound thin film coated on the pattern layer 2 may be used as a separator. The pattern layer 2 may differ from the imprinting member 1 in their shapes as long as desired microstructure is formed in the surface thereof.

In this embodiment the plate supporting the substrate 3 is made of two kinds of transparent materials, but the plate may be formed of a single material. In order to prevent hindrance of irradiation of the deformable layer with the electromagnetic ray, it is necessary to take note of the position of vacuum suction ports. When the vacuum suction ports are formed by machining, cut faces should be polished so as to the suction ports do not hinder the light transmittance.

The imprinted and cured deformable layer can be applied to production of information recording media such as magnetic recording media discs, optical recording media discs, etc. The imprinted deformable layer can also be applied to large scaled integrated circuits, micro lens, wavelength filters, luminescent elements, optical integrated circuits, bio engineering devices such as immunity analysis, DNA analysis, cell cultivation, etc.

Embodiments

The present invention will be further explained in detail by reference to drawings.

Embodiment 1

In this embodiment the stamper A2 shown in FIG. 1B and the imprinting apparatus shown in FIG. 3 were used to carry out imprinting the microstructure on the deformable layer.

Figure 2:
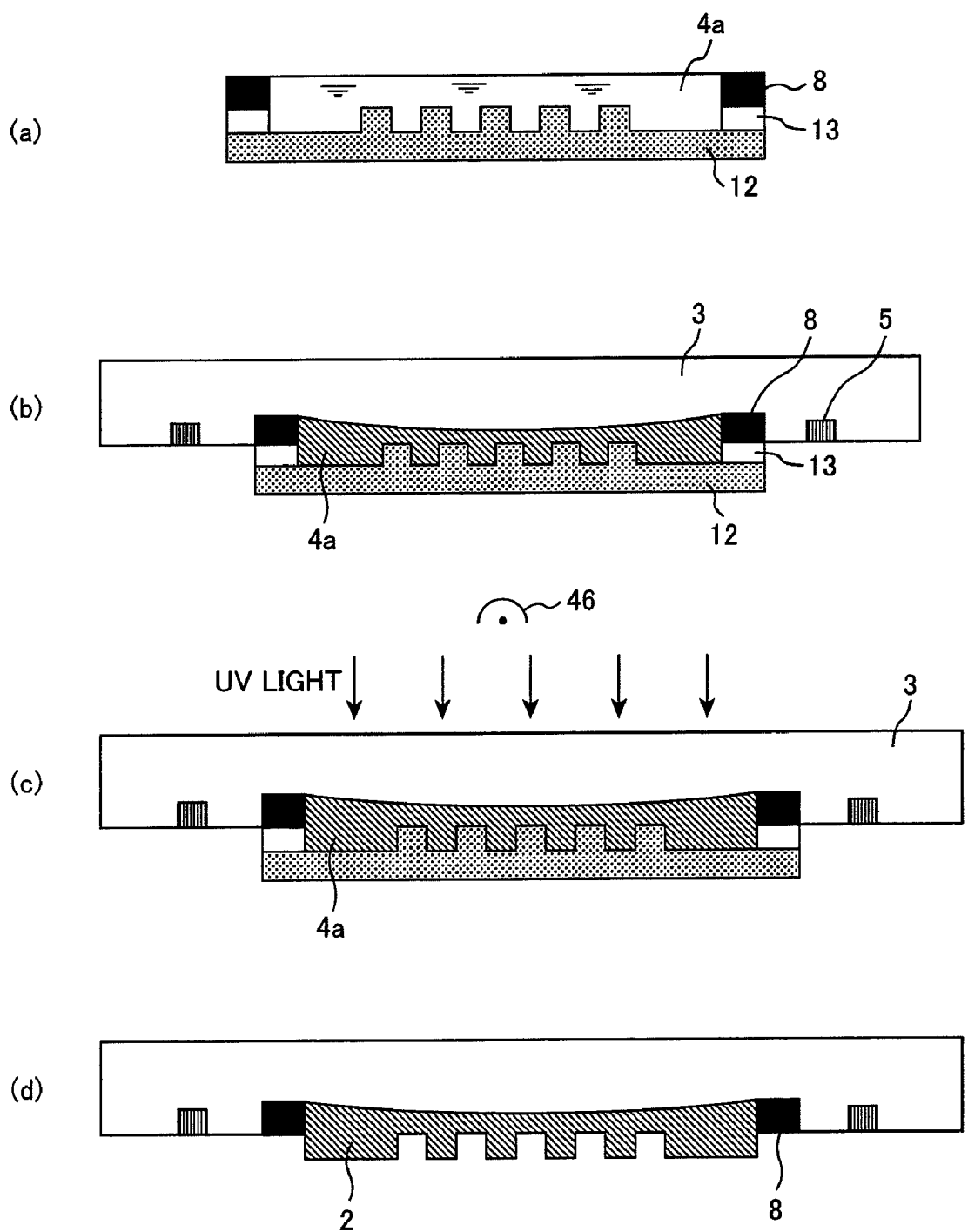
FIG. 2 shows a flow diagram of manufacturing a stamper.

A method of manufacturing the stamper A2 is explained by reference to FIG. 2.

The original mold plate 12 was provided with a first frame 13 and the second frame 8 each being located to surround the periphery of the mold plate 12 so that a cavity is formed on the mold plate. The mold plate of single crystal had a diameter of 70 mm, a thickness of 0.5 mm. The mold pattern was formed by electron beam lithography. The formed patter was provided with grooves each having a width of 50 nm, depth of 80 nm with a pitch of 100 nm in a concentric relation.

The first frame 13 having an outer diameter of 75 mm, an inner diameter of 65 mm and height of 0.5 mm was fixed to the periphery of the original mold plate. The second frame 8 having an outer diameter of 75 mm, an inner diameter of 65 mm and a thickness of 0.5 mm was fixed on the first frame as shown in FIG. 2 (a). Photo-curable resin 4a was filled in the cavity on the mold plate 12. The substrate 3 having a groove 43 for receiving the second frame 8 and a round portion 44 was pressed down to the resin 4a as shown in FIG. 2 (b). The substrate 3 is made of quartz having Young's modulus of 72 GPa and a diameter of 100 mm and a thickness of 2 mm. The groove had an outer diameter of 75 mm and a depth of 0.5 mm, and the round portion had a radius of curvature of 10000 millimeters. The flat portion of the substrate wad provided with a ring shaped positioning mark 5 by dry etching method as shown in FIG. 2 (b).

Ultra violet ray was irradiated to the resin 4a through the substrate 3 to cure the resin 4a as shown in FIG. 2(c).

After the resin 4a was cured, the mold plate 12 and frame 13 were separated from the resin 4a to obtain the imprinted pattern layer 2 as shown in FIG. 2(d).

In the following the imprinting apparatus of the embodiment will be explained by reference to FIG. 3.

The stamper A2 shown in FIG. 1B was fixed to a quartz plate 9 by a vacuum suction with the vacuum suction port 7a.

In this embodiment as the imprinting member 1, glass plate having a diameter of 90 mm, thickness of 0.5 mm was used. The imprinting member 1 was provided with a ring form positioning mark 6 by dry etching method. The substrate 3 was coated with photo-curable resin 11 as a deformable layer in advance. The imprinting member 1 was fixed to the stage 10 by vacuum suction.

Figure 4:
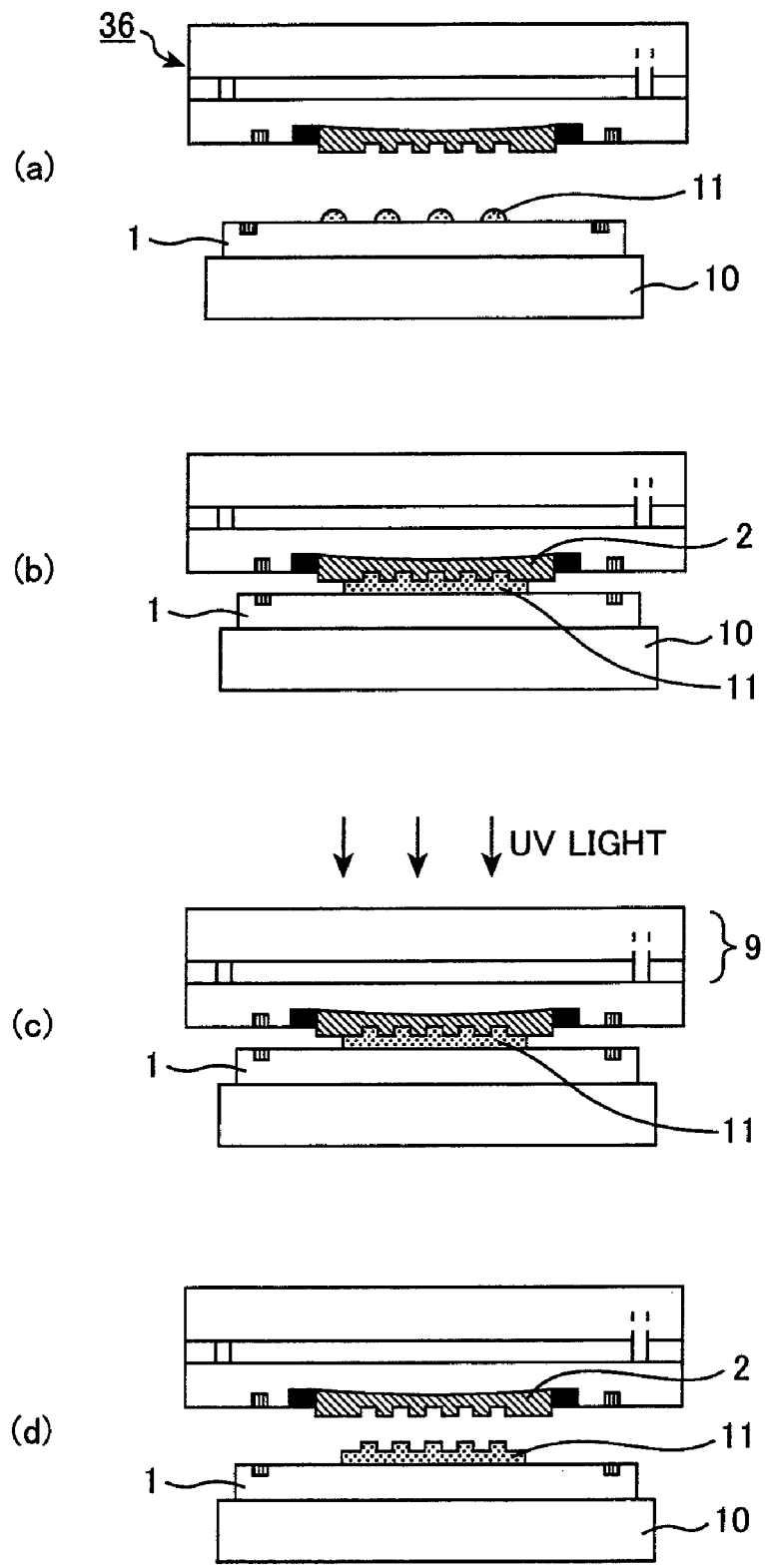
FIG. 4 shows a flow diagram of a method of imprinting the microstructure using the imprinting apparatus.

Next, a method of imprinting the microstructure using the stamper and the imprinting apparatus of the present invention will be explained by reference to FIG. 4.

The resin coat 11 was acrylate resin containing photo-sensitizer of which viscosity was controlled to be 4 mPa·s. The resin was coated with a Piezo type coating head having 512 nozzles (256×2 rows). A distance between nozzles in a direction of rows was 70 μm and that between the rows was 140 μm. Each nozzle was controlled to eject resin of about 5 pL. The pitch between the droplets of the resin was 150 μm in radius direction of the imprinting member 1 and 270 μm in a circumferential direction.

The imprinting member 1 carrying the resin coat 11 was set on the stage as shown in FIG. 4(a). The stage 10 was moved in a horizontal direction in accordance with reflection signals from the positioning marks 5, 6 with an optical sensor 66 shown in FIG. 3 so that the stage 10 and the imprinting member 1 were appropriately aligned.

The stage was moved upward to bring the deformable resin coating 11 into contact with the pattern layer 2 to spread the coating on the imprinting member 1 as shown in FIG. 4(b). Ultra violet ray was irradiated through the plate 9, substrate 3 and pattern layer 2 to cure the deformable resin of photo-curable resin as shown in FIG. 4(c). After the deformable resin s Was cured, the stamper A2 was separated from the deformable resin to obtain the imprinted microstructure as shown in FIG. 4(d).

Figure 5:
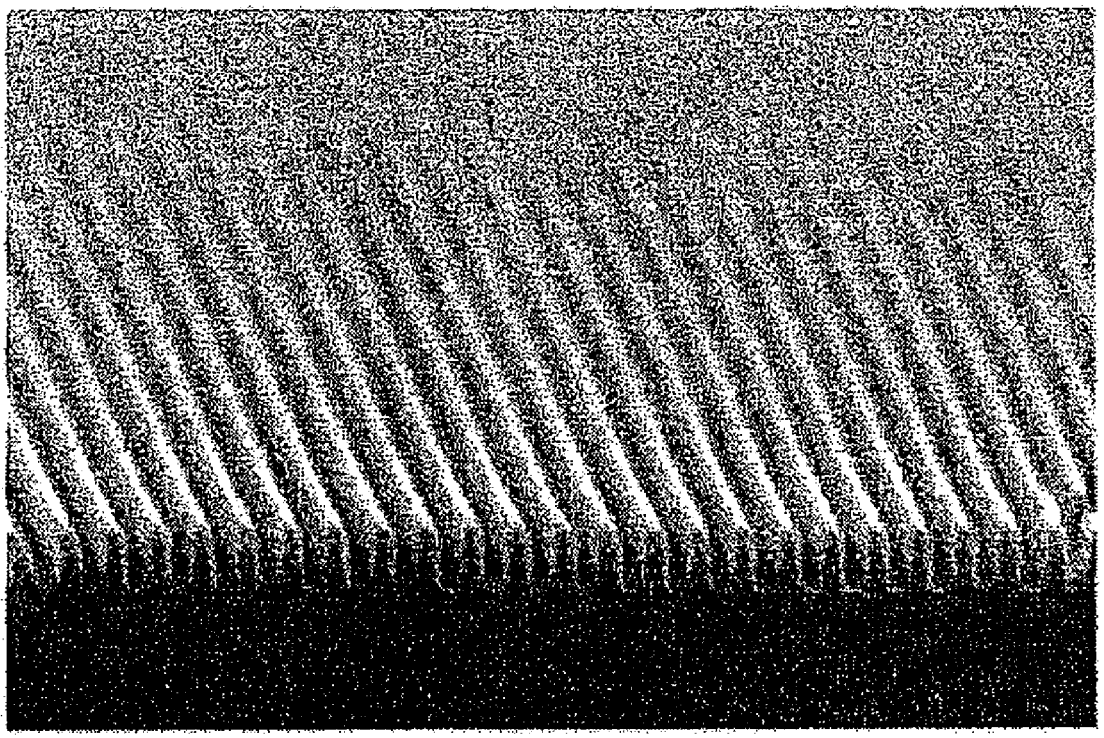
FIG. 5 is an electron beam photograph of the imprinted member.

After the imprinting member 1 carrying the imprinted pattern layer was taken out from the imprinting apparatus, the imprinted pattern layer was observed with SEM. As shown in FIG. 5, there were formed a resin matrix having a thickness of 20 nm and grooves on the resin matrix each having a width of 50 nm, depth of 80 nm, and the pitch between the grooves was 100 nm.

Embodiment 2

Figure 6A:
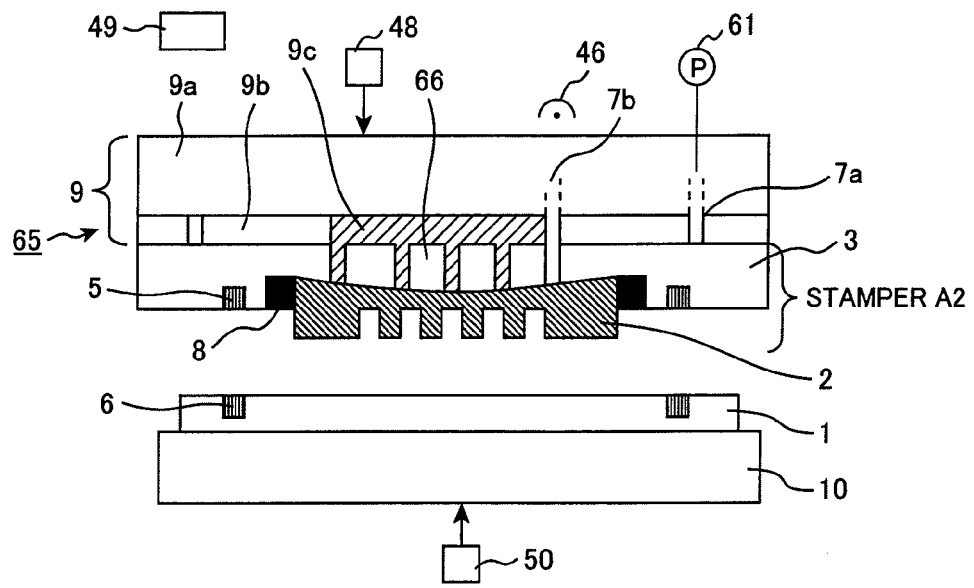
FIG. 6A shows a cross sectional view of an imprinting apparatus of another embodiment of the present invention.

This embodiment will be explained by reference to figures. FIG. 6A shows a diagrammatic view of another embodiment of an imprinting apparatus of the present invention. In this embodiment the stamper was held by vacuum suction, while in embodiment 1 the pattern layer 2 was bonded to the substrate 3 with an adhesive. The stamper has a substrate having vacuum cavities, which are evacuated by a vacuum pump. The pattern layer 2 and the substrate 3 can be separated. The components of the imprinting apparatus are substantially the same as in FIG. 3A.

Figure 6B:
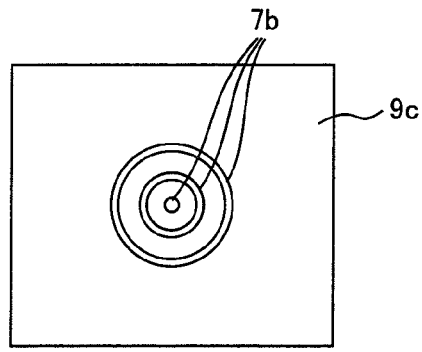
FIGS. 6B-6D show plan views of plates for supporting the stamper.
Figure 6C:
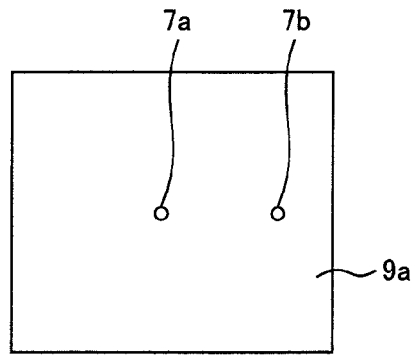
Figure 6D:
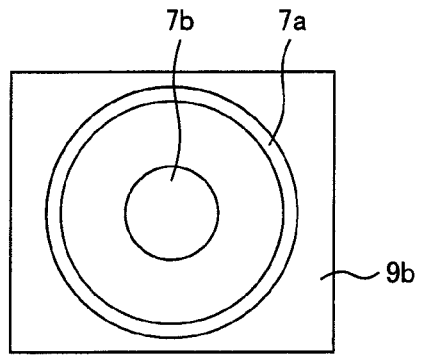

FIG. 6B shows a plan view of a substrate 9c having cavities 66, FIG. 6C shows a plan view of a plate 9a having vacuum suction ports 7a, 7b and FIG. 6D shows a plan view of a plate 9b having circular suction ports 7a, 7b.

Figure 7:
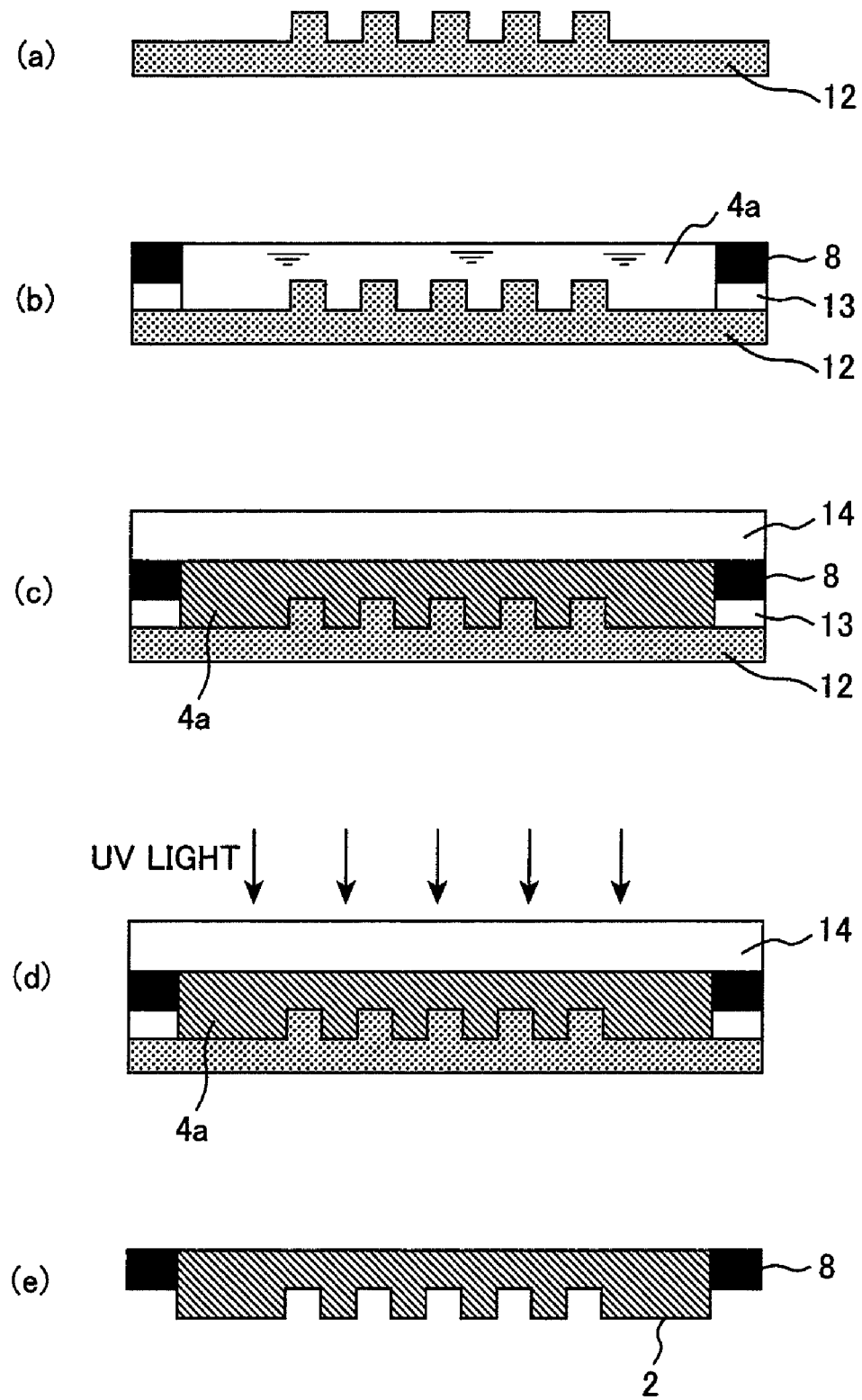
FIG. 7 shows a flow diagram of a process for preparing another imprinted member.

FIG. 7 shows a process for manufacturing a pattern layer for a stamper shown in FIG. 6, wherein the pattern layer is not supported by a substrate 3. The original mold plate 12 made of silicon single crystal had a diameter of 100 mm and a thickness of 0.5 mm was provided by an electron beam drawing method with a microstructure of grooves each having a width of 50 nm, a depth of 80 nm and a pitch between the grooves of 100 nm in concentric relation as shown in FIG. 7(a).

The mold plate was treated with a fluorine containing separator in advance. A first frame 13 and second frame 8 were fixed on the periphery of the mold palate. The first frame made of Teflon (registered trademark) has an outer diameter of 75 mm, an inner diameter of 65 mm and a thickness of 0.5 mm. The second frame 8 made of glass was fixed on the first frame had an inner diameter of 75 mm, an inner diameter of 65 mm and a thickness of 0.5 mm. As a result, a cavity was formed on the mold plate. A liquid photo-curable resin 4a for the pattern layer 2 was charged in the cavity as shown in FIG. 7(b).

A flat glass plate 14 was placed on the resin 4a and pressed towards the mold plate to imprint the pattern of the mold plate as shown in FIG. 7(c).

Then, ultraviolet ray was irradiated to the resin 4a through the glass plate 14 to cure the resin 4a in the cavity as shown in FIG. 7(d).

The glass plate and the mold plate were separated from the imprinted resin 4a to obtain a pattern layer as shown in (e). The pattern layer is provided with a glass made frame 8 surrounding the periphery of the pattern layer. The resulting pattern layer was used in the stamper of the present invention.

As the substrate 3, a quartz plate having a diameter of 100 mm and a thickness of 2 mm and having a flat face on one side was used. The other side of the substrate was machined wherein a range of 75 mm from the center was cut down by 0.5 mm to form small cavities 63 as shown in FIG. 6. The central portion in a region of 65 mm was machined to form a round shape with a radius of curvature of 10000 mm that protrudes towards the rear face of the pattern layer 2. FIG. 6B shows a plan view of the substrate having three circular cavities 7b in concentric relation. FIG. 6B shows a plan view of the plate 9b having two vacuum suction passages 7a, 7b.

The cavities communicate with the vacuum suction ports 7a, 7b to fix the pattern layer to the substrate 3. The cavities were machined by dry etching. The positioning marks were formed by dry etching.

The plate 9 consists of two quartz plates 9a, 9b. FIG. 6C and FIG. 6D show plan views of plate 9a and 9b, respectively. The plates 9a, 9b have vacuum suction port 7b for fixing the pattern layer 2 and the vacuum suction port 7a for fixing the substrate 3 to the plate 9. The vacuum suction ports are connected to evacuation means such as a vacuum pump 61.

The substrate 3 was fixed to the plate 9 by vacuum suction force. The pattern layer 2 was fixed to the substrate by vacuum suction force by means of the suction port 7a.

Using the stamper and the apparatus shown in FIG. 6A, an imprinting method was carried out in the same manner as in embodiment 1. As a result, a pattern layer was obtained wherein a groove pattern each groove having a width of 50 nm, a depth of 80 nm and a pitch of 100 nm on the resin matrix having a thickness of 20 nm was formed. The resulting pattern corresponded to the microstructure of the stamper.

Embodiment 3

Figure 8:
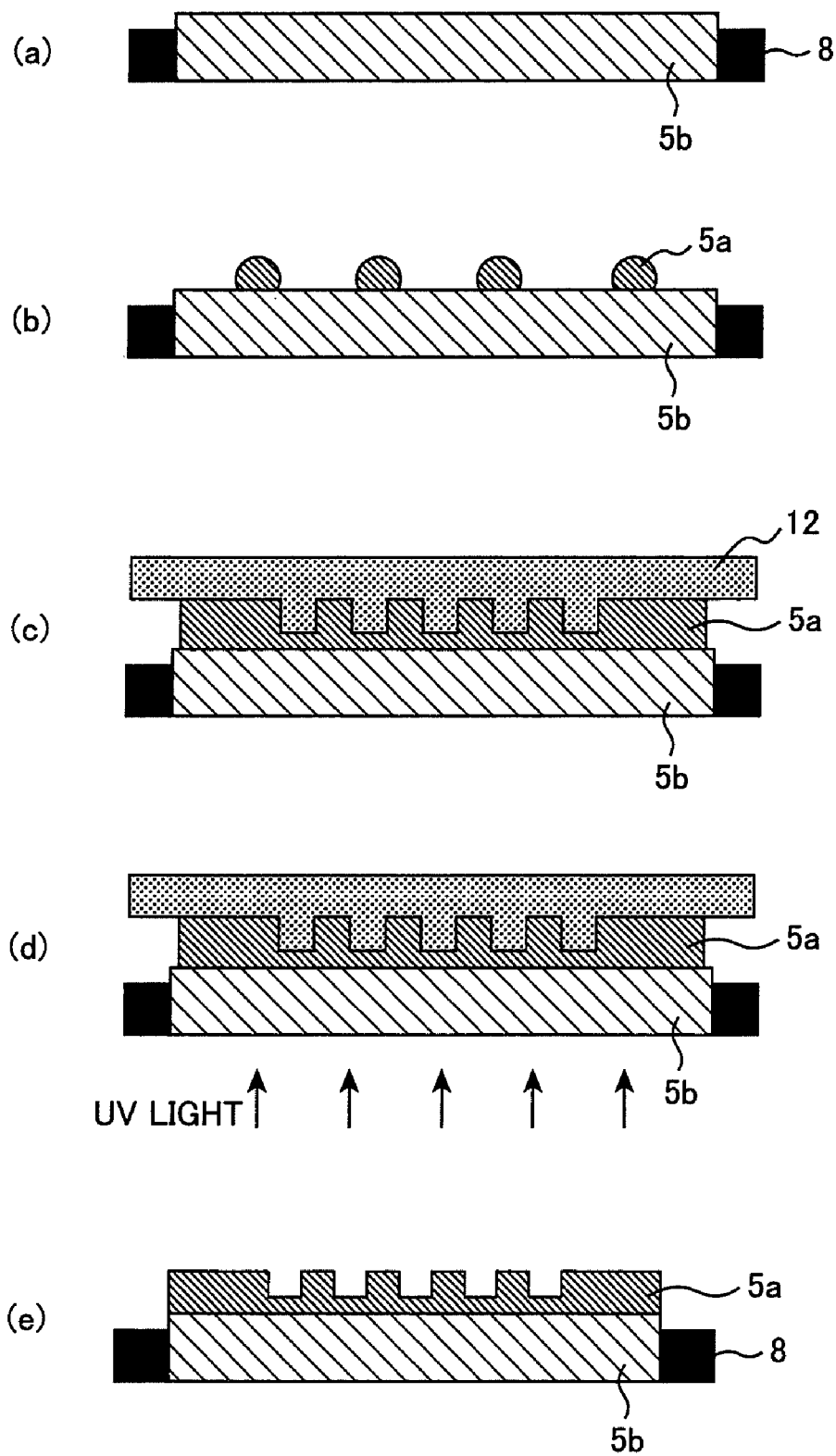
FIG. 8 shows a flow diagram of a process for preparing still another imprinted member.

Embodiment 3 will be explained in detail by reference to FIG. 8. In this embodiment the pattern layer differs from that of embodiment 2. The pattern layer consists of two kinds of resins 5a, 5b, which were laminated as shown in FIG. 8(b).

The resin layer 5b was made of polyurethane resin having a diameter of 65 mm and Young's modulus of 10 MPa. The periphery of the resin plate 5b was surrounded by a frame 8 made of glass as shown in FIG. 8 (a). The resin plate 5b was coated with photo-curable polyester resin 5a in dotted form as shown in FIG. 8 (b).

An original mold plate 12 made of silicon single crystal having a diameter of 100 mm and a thickness of 0.5 mm was pressed down to the photo-curable resin coating on the resin plate 5b to expand the resin coating and imprint the pattern of the original pattern plate 12 as shown in FIG. 8(c). The original pattern was provided with a groove pattern each groove having a width of 50 nm, a depth of 80 nm and a pitch between the grooves of 100 nm.

Ultra violet ray was irradiated to the resin coating 5a through the resin substrate 5b to cure the imprinted resin coating 5a. After the imprinted resin coating was cured, the pattern layer 5a was separated from the original pattern plate 12. The resulting imprint pattern had the microstructure, which highly corresponded to the pattern of the original pattern. The periphery of the imprint pattern layer was provided with a frame, which strengthens the mechanical strength of the substrate 5a.

Using the stamper having the pattern layer 2, an imprint pattern was obtained wherein the pattern had a width of 50 nm, a depth of 80 nm and a pitch between the grooves of 100 nm on the resin matrix having a thickness of 20 nm.

Embodiment 4

In this embodiment a large scaled magnetic recording medium (discrete track media) having a microstructure was manufactured using the stamper and the imprinting apparatus of embodiment 1.

As the imprinting member 1 for the imprint pattern, a glass substrate for magnetic recording media having a diameter of 65 mm, a thickness of 0.631 mm and a center hole of a diameter of 20 mm was used.

Droplets of photo-curable resin were dropped on the imprinting member 1 made of glass substrate with an ink jet. The resin contained a photo-sensitizer and had a viscosity of 4 mPa·s. The ink jet head had 512 nozzles (256×2 rows), which eject ink by a Piezo system, and a distance between nozzles was 70 μm in a direction of rows and a distance between the rows was 140 μm. Each nozzle was controlled to eject about 5 pL of the resin. The pitch of the droplets was 150 μm in a radius direction and 270 μm in a circumferential direction of the imprinting member.

In the same manner as in embodiment 1 the imprinting member made of glass was provided with a minute groove pattern having a width of 50 nm, a depth of 80 nm and a pitch between the grooves of 100 nm, which were faithful to the pattern layer of the stamper.

Embodiment 5

Figure 9:
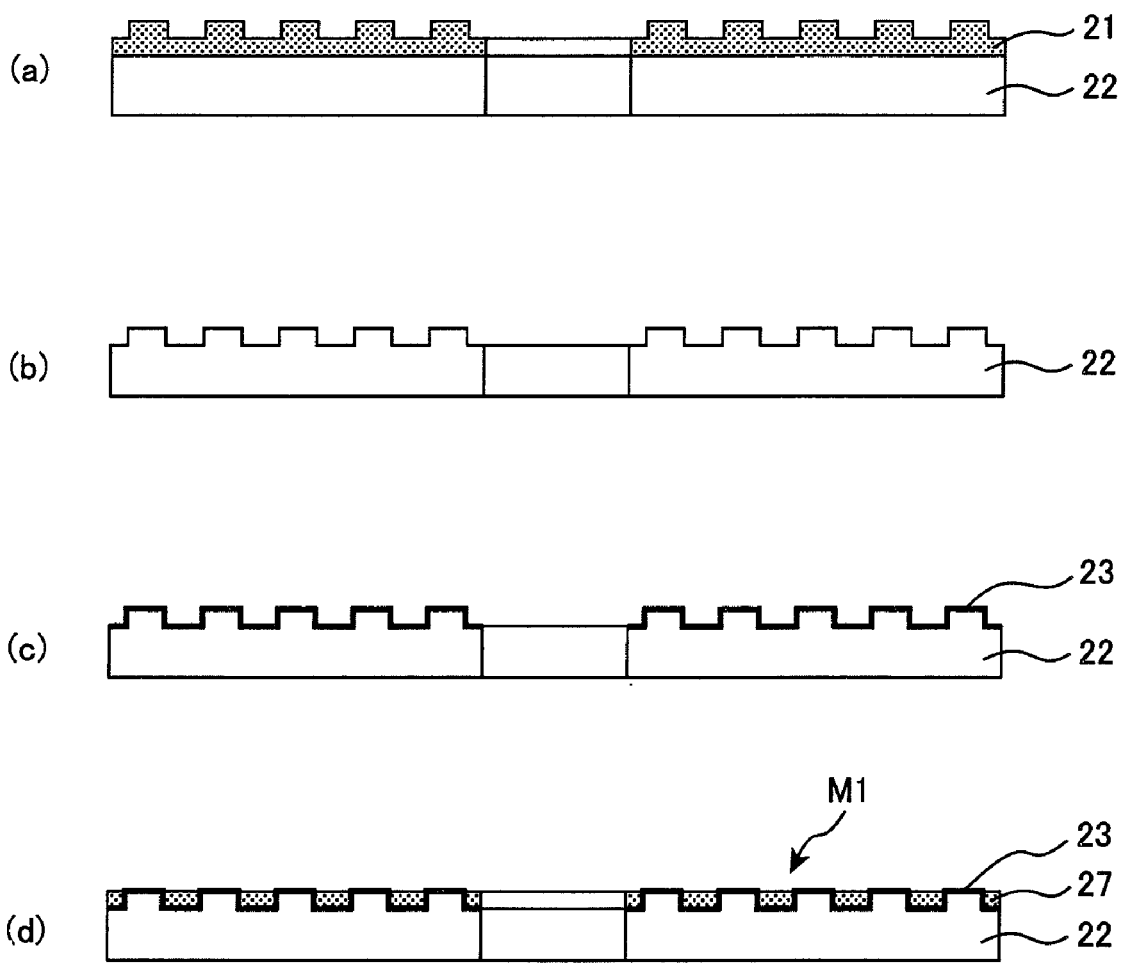
FIG. 9 shows a flow diagram of a method of manufacturing a recording medium disc of an embodiment of the present invention.

In this embodiment a method of manufacturing a discrete track media of the present invention will be explained in detail by reference to FIG. 9, which shows a flow chart of the method.

As shown in FIG. 9(a), the glass substrate 22 obtained in embodiment 4 was prepared wherein the glass substrate 22 had the pattern layer 21 made of photo-curable resin.

The surface of the glass substrate 22 was machined by dry-etching method using the pattern layer 21 as a mask as shown in FIG. 9(b). The top face of the glass substrate 22 was provided with a microstructure, which was faithful to the pattern layer of the stamper. In the dry etching method fluorine containing gas was used. The dry etching can be conducted by removing the thin film (resin matrix, other than the protrusions) with oxygen plasma, followed by the etching the exposed portions with the fluorine containing gas.

As shown in FIG. 9(c), the pattern machined surface of the glass substrate 22 was provided by a DC magnetron sputtering method (Japanese patent laid-open 2005-38596) with a magnetic recording layer 23 comprising a pre-coating layer, a magnetic segment control layer, a soft magnetic under layer, an intermediate layer, a vertical recording layer and a protecting layer in order. The magnetic segment control layer was formed by a non-magnetic layer and an anti-ferromagnetic layer.

Next, as shown in FIG. 9(d), a non-magnetic layer 27 was formed on the magnetic recording layer 23 to smooth the surface of the glass substrate 22. As a result, a discrete track media MI having a surface recording density equivalent to 200 GbPsi was obtained.

Embodiment 6

Figure 10:
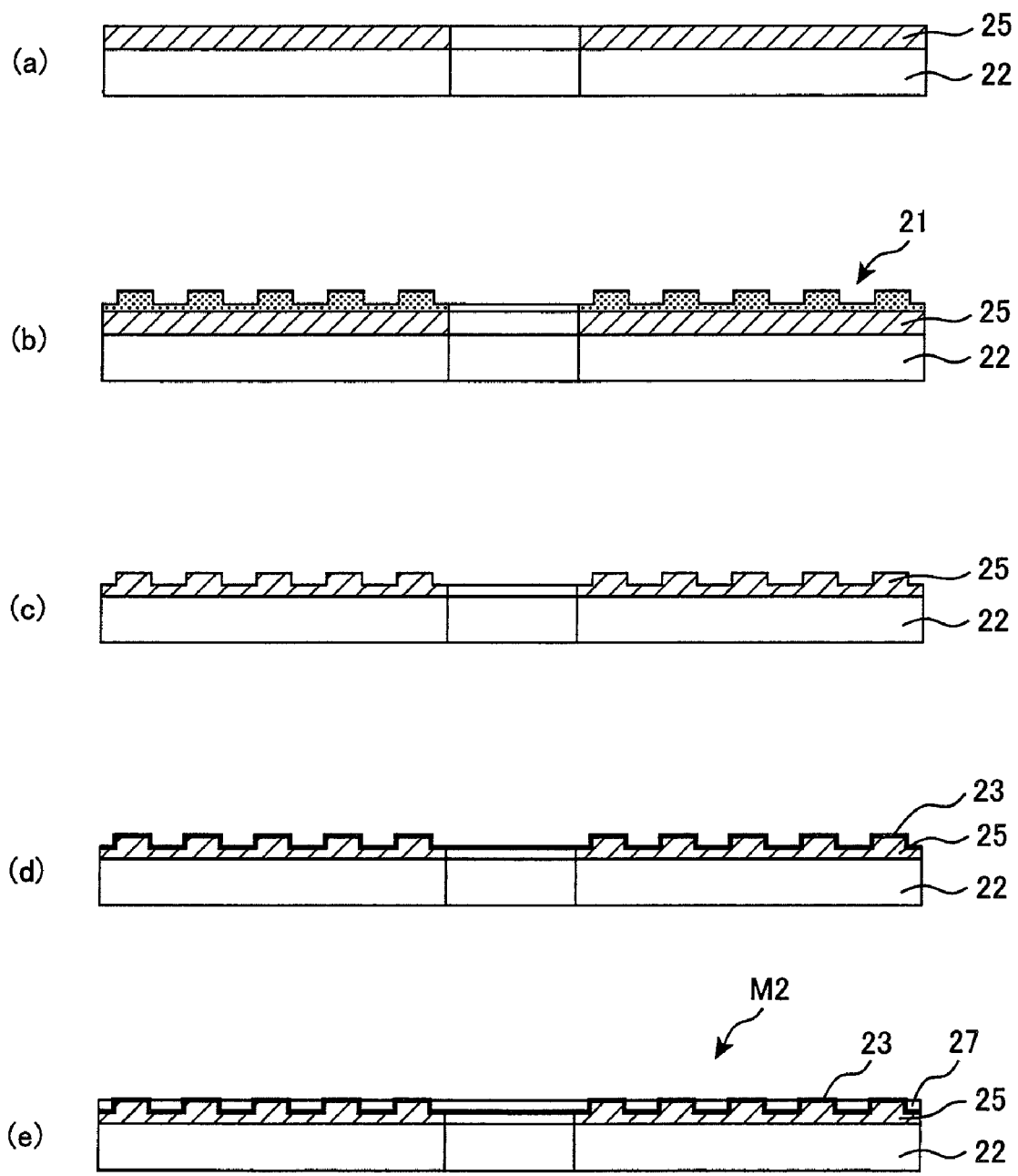
FIG. 10 shows a flow diagram of a method of manufacturing another recording medium disc of an embodiment of the present invention.

In this embodiment a discrete track media was produced using the imprinting method of the present invention, which will be explained by reference to FIG. 10.

In place of the glass plate 22 having the pattern layer 21 used in embodiment 4, the following substrate was prepared. The substrate has, as shown in FIG. 10(b), an under layer 25 of soft magnetic material on the substrate. A photo-curable resin layer was formed on the surface of the under layer, and the pattern layer 21 of the photo-curable resin was formed in the same manner as in embodiment 1.

The soft magnetic under layer 25 was subjected to dry etching treatment in a fluorine containing gas atmosphere using the pattern 21 as a mask. As a result, as shown in FIG. 10(c), the desired pattern was formed on the soft magnetic under layer 25.

Next, as shown in FIG. 10(d), a magnetic recording medium layer 23 comprising a pre-cost, a magnetic segment control layer, a soft magnetic under layer, an intermediate layer, a vertical recording layer and a protecting layer was formed on the pattern of the under layer by a DC magnetron sputtering method (Japanese patent laid-open 2005-38596). The magnetic segment control layer consisted of a non-magnetic layer and an anti-ferromagnetic layer.

Next, as shown in FIG. 10(e), a non-magnetic layer 27 was formed on the magnetic recording layer 23 to smooth the surface of the soft magnetic under layer 25 to thereby obtain a discrete track media M2 with a surface recording density to 200 GbPsi.

Embodiment 7

Figure 11:
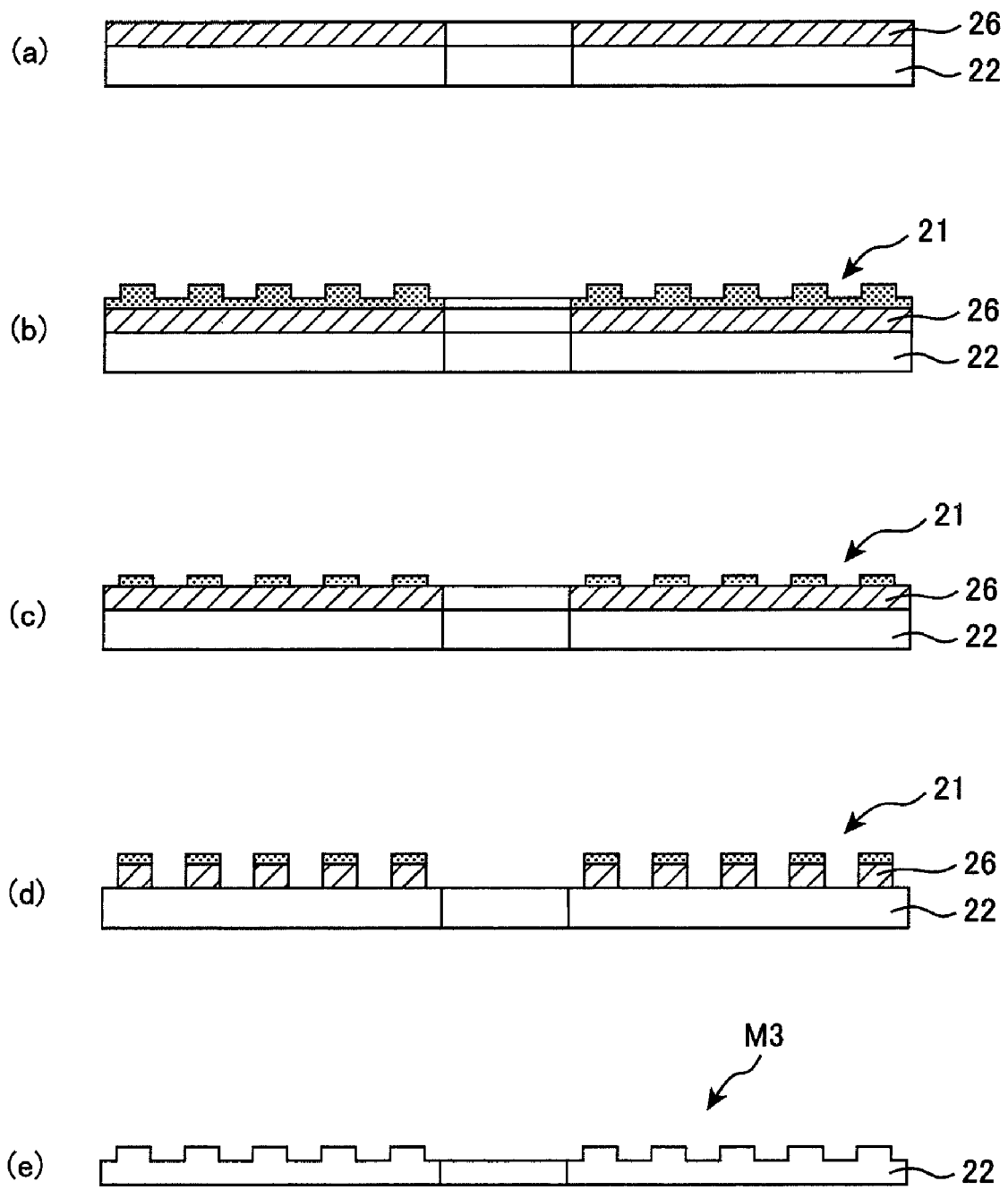
FIG. 11 shows a flow diagram of a method of manufacturing a recording medium disc of still another embodiment of the present invention.

In this embodiment a method of manufacturing a substrate for discrete track media will be explained by reference to FIG. 11 in detail.

As shown in FIG. 11(a), a flat layer 26 of novolac resin material was formed on a glass substrate 22. The flat layer 26 may be formed by a spin coating method or by a method of pressing resin to the substrate using a plate. Next, as shown in FIG. 11(b), a pattern forming layer 21 was formed on the flat layer 26. The pattern forming layer 21 was formed by coating silicone resin on the flat layer 26, and the pattern forming layer was imprinted with a stamper of the present invention.

As shown in FIG. 11(c), the resin matrix (other than the protrusions) was removed by dry etching with a fluorine containing gas. Next, as shown in FIG. 11(d), the residue of the pattern forming layer 21 was used as a mask to remove the exposed portions of the remaining flat layer 26 by an oxygen-plasma etching method. Thereafter, the remaining pattern forming layer 21 was removed by etching the surface of the glass substrate 22 in a fluorine containing gas to produce a disc substrate with a surface recording density to 200 GbPsi for discrete track media, as shown in FIG. 11(e).

Embodiment 8

Figure 12:
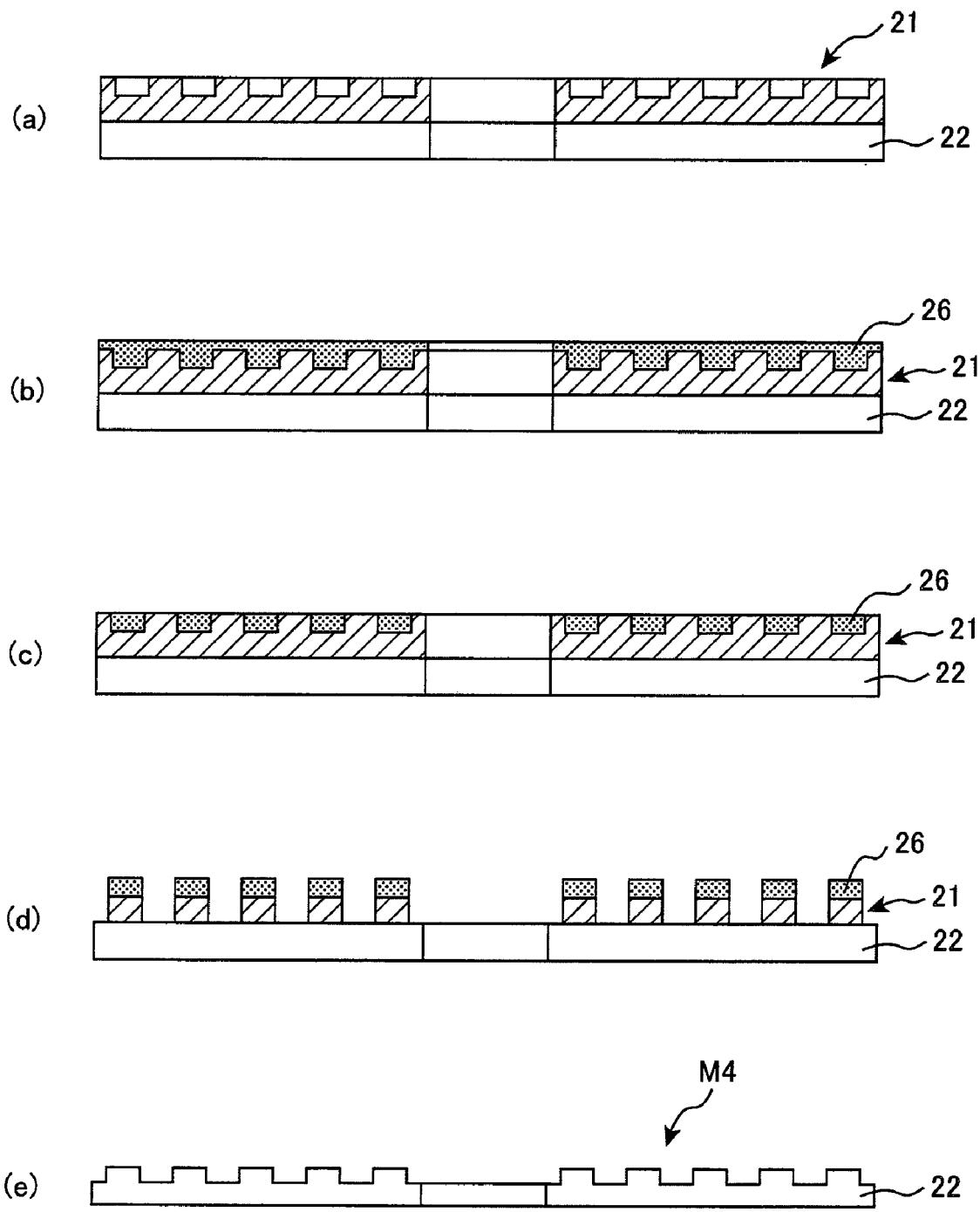
FIG. 12 shows a flow diagram of a method of manufacturing a recording medium disc of a still further embodiment of the present invention.

In this embodiment a method of manufacturing a disc substrate for discrete track media will be explained in detail by reference to FIG. 12.

As shown in FIG. 12(a), acrylate resin containing a photo-sensitizer (deformable layer) was coated on the surface of the glass substrate, and a pattern forming layer 21 was formed on the glass substrate using the imprinting method of the present invention. In this embodiment a pattern that has reverse protrusions of the pattern to be formed was formed on the glass substrate 22. Then, as shown in FIG. 12(b), resin material containing silicon and a photo-sensitizer was coated on the pattern forming layer 21 to form a flat layer 26. The flat layer was formed by a spin coating method or a method of pressing the flat layer to the substrate 22.

As shown in FIG. 12(c), the surface of the flat layer was etched with fluorine containing gas to expose the top surface of the pattern forming layer 21.

Next, as shown in FIG. 12(d), the pattern forming layer 21 was removed using the remaining flat layer 26 as the mask by oxygen-plasma etching to expose the surface of the glass substrate 22.

As shown in FIG. 12(e), the exposed surface of the glass substrate 22 was etched with a fluorine containing gas to produce a disk substrate M4 with a face recording density equivalent to 200 GbPsi for discrete track media.

Embodiment 9

In this embodiment an optical information processing apparatus manufactured by the imprinting method of the present invention will be explained.

Figure 13:
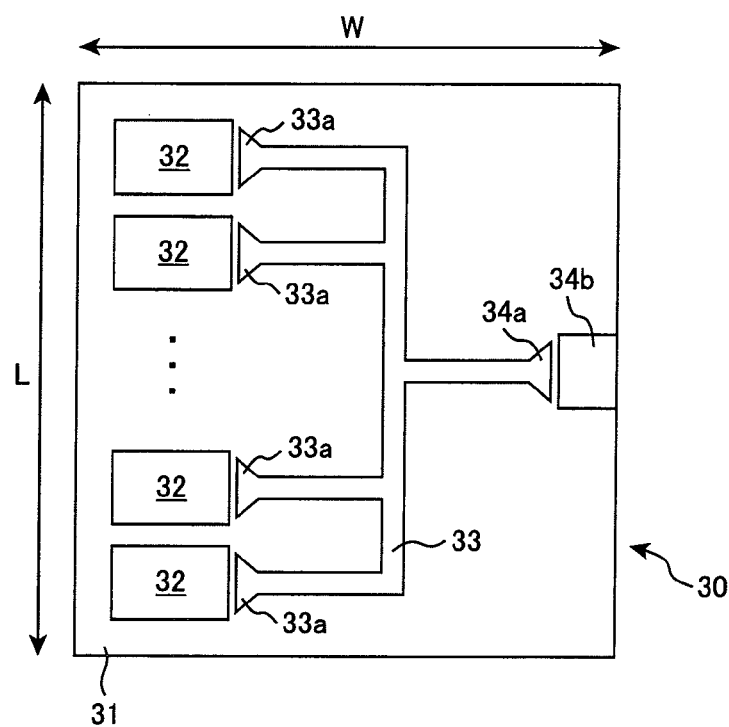
FIG. 13 shows a diagrammatic plan view of an optical circuit according to an embodiment of the present invention.
Figure 14:
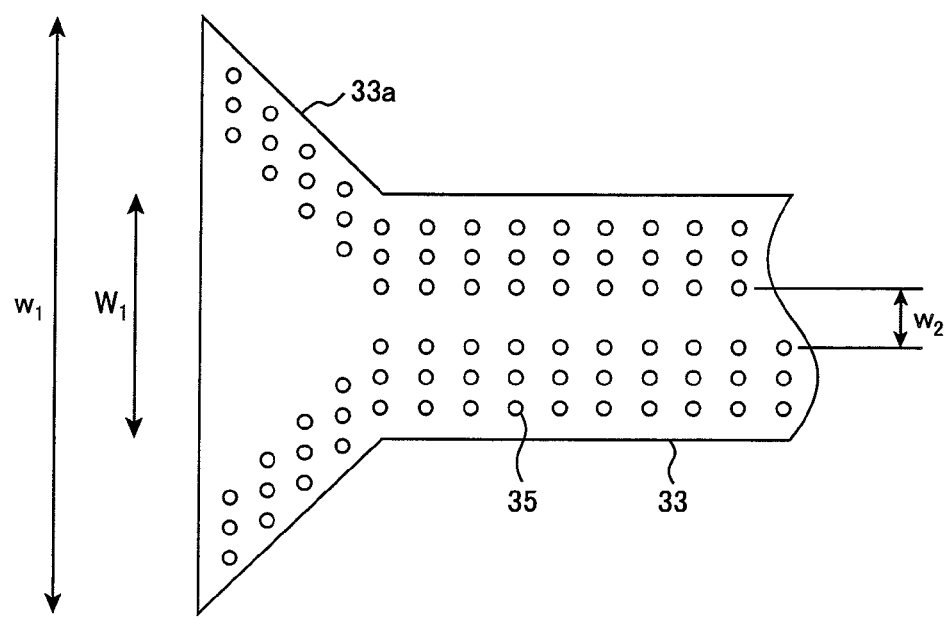
FIG. 14 shows a diagrammatic view of an optical guide path used in the optical circuit shown in FIG. 13.

In this embodiment an optical device for changing a light impinging direction was applied to optical multiplex information processing apparatus will be explained. FIG. 13 is a diagrammatic plan view of the optical circuit as an element of an optical device. FIG. 14 shows a diagrammatic view of an optical guide path.

As shown in FIG. 13, the optical guide path 30 was formed on a substrate 31 made of aluminum nitride of a length L of 30 mm, a width W of 5 mm and a thickness of 1 mm. The optical circuit 30 comprises a plurality of oscillation units 32 each comprising a semiconductor laser of indium-phosphor and a driver circuit, optical guide paths 33, 33a, and optical connectors 34a, 34b. The oscillating wavelength of the semiconductor lasers was set to be different from each other by 2 to 50 nm.

The optical circuit 30 transmits optical signals inputted into the oscillation unit 32 through the optical guide path 33a, 33 to the optical connector 34a, 34. The optical signals are assembled by the optical guide paths 44a.

As shown in FIG. 14, there are columnar micropillars 35 inside the optical guide path 33, 33a,34b. An alignment error of the oscillating units 32 and optical guide paths 33 was allowed by setting the input section of the optical guide path 33a having a width ($W_1$) of 20 µm and a shape of a trumpet. In the above optical guide path shown in FIG. 14 the guide path 33a having a width ($w_1$) and the input region of the oscillating unit 32 having 20 µm were aligned by employing the stamper of the present invention.

One row of micro pillars in the central part was removed to form a region of a width ($w_2$) where there is no photonic gap thereby to guide the signal light to that region. A distance (pitch) between micro pillars 35 was set to be 0.5 µm. The number of micro pillars shown in FIG. 14 is much less than the actual number.

The stamper and the method of imprinting a microstructure of the present invention were applied to the preparation of the micro pillars. In forming the micro pillars 35 in the oscillating units 32 the stamper having the microstructure was aligned and pressed to a deformable resin layer coated on a substrate. The imprinted deformable layer is cured by irradiating ultra violet ray, for example. The imprinted layer is separated together with the substrate from the stamper. A structure of the plan structure of the optical connector 34a has one reversed in right and left sides with respect to the optical guide paths in FIG. 13.

A equivalent diameter (a diameter or length of one side) of the micro pillars 35 is set to be 10 nm to 10 µm in considering the wavelength of light source used for semiconductor laser, etc. The height of the micro pillars is preferably 50 nm to 10 µm. A pitch between the micro pillars is determined by a wavelength of signals.

The optical circuit 30 may emit signal light superimposing plural signals. Since it may change the travel direction of the light, it is possible to shorten the width (W) of the optical circuit 30. As a result, the optical circuit can be minimized.

According to the imprinting method of the present invention, it is possible to reduce a production cost of the optical circuits because the micro pillars are simply formed by stamping the stamper. The present invention can be applied to any optical devices in addition to the optical device for superimposing optical signals.

Embodiment 10

Figure 15:
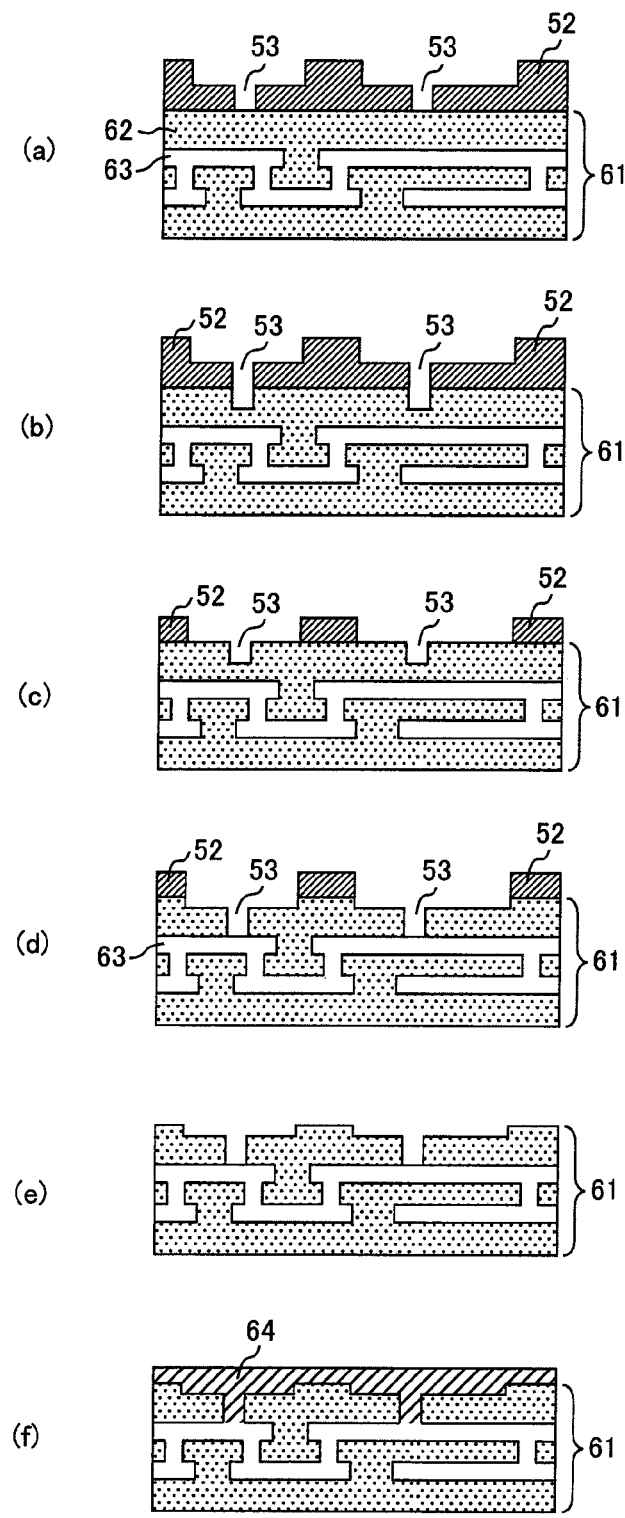
FIG. 15 shows a flow diagram of a process for manufacturing a multi-layered printed circuit substrate of an embodiment of the present invention.

The present invention can be applied to a method of manufacturing a multi-layered printed circuit board as shown in FIG. 15.

As shown in FIG. 15(a), a resist layer 52 comprising silicon oxide film 62 and copper wiring 63 is coated on a substrate 61 on which a pattern layer of the stamper having a pattern layer of the microstructure is contacted and pressed to imprint the pattern. Prior to imprinting, the relative position between the stamper and the printed circuit board on the stage is adjusted by a control device so that the pattern is precisely imprinted on the coating.

Thereafter, portions 53 of the imprinted pattern 52 are subjected to dry etching with $CH_4/H_2$ gas to form grooves below the portions 53 as shown in FIG. 15(b). Next, the resist 52 is etched out by RIE (Reactive Ion Etching) to remove the lower parts of the resist until the surface of the board is exposed as shown in FIG. 15(c). An exposed area 53 of the board becomes large around the resist 52. Further, the RIE etching is continued until the grooves arrive at the copper wiring 63 as shown in FIG. 15(d).

Thereafter, the remaining resist 52 was removed to the multi layered printed circuit board having grooves in the surface as shown in FIG. 15(e). After a metal film (not shown) is formed on the surface of the board 61, electro plating is applied to form metal plating film 64 as shown in FIG. 15(f). Thereafter, polishing of the metal film 64 is continued until the silicon oxide film 62 of the circuit board 61 is exposed as shown in FIG. 15(g).

Figure 16:
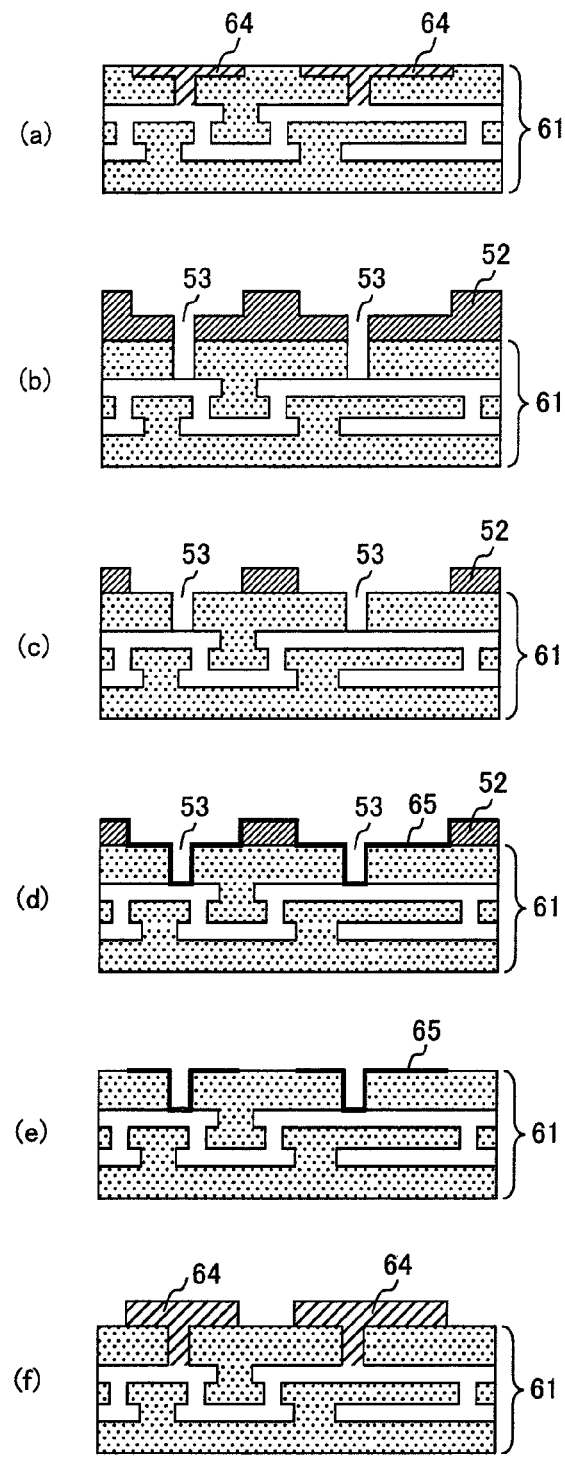
FIG. 16 shows another flow diagram of a process for manufacturing a multi-layered printed circuit substrate of an embodiment of the present invention.

Another method of manufacturing the circuit board will be explained by reference to FIG. 16.

In dry etching of the exposed area 53 shown in FIG. 16(a), the etching is continued until the etching arrives at the copper wiring 63 of the circuit board 61. Then, the resist 52 was removed by RIE to remove the lower part of the resist 52 as shown in FIG. 16(b). A metal film 65 by sputtering was formed on the surface of the circuit board 61 as shown in FIG. 16(c).

Thereafter, the resist 52 was removed by lift-off to form a circuit board shown in FIG. 16(d) wherein the metal film 65 remains partially on the surface of the circuit board 61. Then, electroless plating is applied to the metal film 65 to produce the multi layered printed circuit board 61 having wiring of the metal film 64.

What is claimed is:

1. A method of imprinting a microstructure comprising:
   providing a stamper comprising a pattern layer having a microstructure of the order of from micrometers to nanometers in one face of the pattern layer and a substrate supporting the pattern layer, wherein the pattern layer is supported on a round surface having at least one prescribed radius of curvature of the substrate, the center of the round surface protruding towards a rear face of the pattern layer, the substrate having a portion adjacent to the round surface, and a first alignment mark being on the portion of the substrate;
   providing an imprinting member having a deformable layer and a second alignment mark being on a portion of the imprinting member for aligning the pattern layer and the deformable layer;
   aligning the substrate and the imprinting member by optically detecting light reflected from the first alignment mark and the second alignment mark with a photosensor, wherein the first alignment mark and the second alignment mark are in an opposed relation;
   contacting the stamper with the imprinting member having the deformable layer to which the microstructure is imprinted;
   curing the deformable layer on the imprinting member; and
   separating the stamper from the cured deformable layer.

2. The method of imprinting the microstructure according to claim 1, wherein the deformable layer contains a photocurable component, and the curing of the deformable layer is conducted under irradiation of light through the substrate and the pattern layer.

3. The method of imprinting the microstructure according to claim 1, wherein the deformable layer is a thermoplastic resin sheet or film.

4. The method of imprinting the microstructure according to claim 1, wherein the substrate of the stamper has a Young's modulus higher than a Young's modulus of the pattern layer.

5. The method of imprinting the microstructure according to claim 1, wherein the substrate and the pattern layer have transparency to light for curing the deformable layer.

6. The method of imprinting the microstructure according to claim 1, wherein the pattern layer is fitted with a frame formed between the center of the substrate and the periphery of the substrate.

7. The method of imprinting the microstructure according to claim 1, wherein the round surface has different curvatures.

8. A method of manufacturing a recording medium disc comprising:
- providing a stamper for imprinting a microstructure, wherein the stamper comprises a pattern layer having the microstructure and a substrate supporting the pattern layer with a round face having a prescribed radius of curvature of the substrate, wherein the round face protrudes towards a rear face of the pattern layer, the substrate having a portion adjacent to the round face, and a first alignment mark being on the portion of the substrate;
- providing an imprinting member, a deformable member being supported on the imprinting member, a second alignment mark being on a portion of the imprinting member for aligning the pattern layer and the deformable member;
- aligning the substrate and the imprinting member by optically detecting light reflected from the first alignment mark and the second alignment mark with a photosensor, wherein the first alignment mark and the second alignment mark are in an opposed relation;
- preparing the imprinting member by pressing the stamper against the deformable member supported on the imprinting member to imprint the microstructure on the deformable member;
- curing the deformable member on the imprinting member;
- separating the stamper from the imprinting member after the deformable member is cured;
- placing the imprinting member on a recording medium disc as a dry etching mask, wherein a rear face of the imprinting member having no microstructure contacts the surface of the recording medium disc;
- subjecting the imprinting member on the recording medium disc to dry etching through the etching mask to form a pattern according to the imprinted microstructure; and
- forming a recording film on the recording medium disc after the etching mask is removed.

* * * * *